United States Patent [19]

Sekiwa et al.

[11] Patent Number: 5,432,359
[45] Date of Patent: Jul. 11, 1995

[54] LIGHT EMITTING DEVICE WITH ALAS MIXED CRYSTAL RATIOS

[75] Inventors: Tetsuo Sekiwa; Junichi Fujiki, both of Kanagawa, Japan

[73] Assignee: Kabushiki Kaisha Toshiba, Kanagawa, Japan

[21] Appl. No.: 214,043

[22] Filed: Mar. 15, 1994

Related U.S. Application Data

[63] Continuation-in-part of Ser. No. 169,622, Dec. 20, 1993, abandoned.

[30] Foreign Application Priority Data

Dec. 21, 1992 [JP] Japan ................. 4-340097

[51] Int. Cl.$^6$ ........................... H01L 33/00
[52] U.S. Cl. ........................ 257/94; 257/96; 257/97; 257/103; 372/45
[58] Field of Search ............. 257/94, 95, 96, 97, 257/90, 103; 372/45, 46

[56] References Cited

U.S. PATENT DOCUMENTS

| | | | |
|---|---|---|---|
| 5,055,893 | 10/1991 | Sasagawa | 257/94 X |
| 5,073,806 | 12/1991 | Idei | 257/96 |
| 5,172,195 | 12/1992 | Sekiwa | 257/96 |

FOREIGN PATENT DOCUMENTS

| | | |
|---|---|---|
| 56-61189 | 5/1981 | Japan . |
| 60-24084 | 2/1985 | Japan . |
| 2244687 | 9/1990 | Japan . |
| 0448661 | 2/1992 | Japan . |

OTHER PUBLICATIONS

"Ultra High Brightness Visible Light Emitting Diodes", Koike et al., Electronics Parts And Materials, Jan. 1983, pp. 138-141.

"Ultra-High-Brightness 2000 mcd LED And Characteristics", Terazima et al., Electronic Parts And Materials, Jul. 1983, pp. 81-83.

Primary Examiner—William Mintel
Attorney, Agent, or Firm—Finnegan, Henderson, Farabow, Garrett & Dunner

[57] ABSTRACT

A semiconductor light-emitting device and a manufacturing method therefor by which deterioration of external output is sufficiently suppressed under the high temperature and moisture so as to significantly improve pellet yield. A light emitting device of a double hetero structure, includes: a first GaAlAs clad layer of a first conductivity type; an active layer formed on the first clad layer, the active layer having an appropriate AlAs mixed crystal ratio relative to a GaAs crystal so that an emitted light wavelength from the device is substantially between 620 and 940 nm; and a second GaAlAs clad layer of a second conductivity type formed on the active layer, wherein the AlAs mixed crystal ratio on the surface thereof in the second clad layer is equal to or less than 0.67, and a difference of the AlAs mixed crystal ratio between the bottom layer of the first clad layer and the top layer of the second clad layer is equal to or less than 0.3.

6 Claims, 9 Drawing Sheets

AℓAs MIXED CRYSTAL RATIO

| $X_{Al}$ SET AT | SURFACE $X_{Al}$ | TEMPERATURE | Al - ADDED LEVEL (mg)* | GaAs - ADDED LEVEL (g)* |
|---|---|---|---|---|
| 0.74 | 0.76 | 1000° | 533 | 5.33 |
| 0.70 | 0.68 | 1000° | 447 | 5.98 |
| 0.68 | 0.63 | 1000° | 412 | 6.30 |
| 0.64 | 0.46 | 1000° | 352 | 6.94 |

* ADDED WEIGHT AGAINST Ga50g

$X_{Al}$ IN PELLET SURFACE

FIG.8

AlAs MIXED CRYSTAL RATIO

1~5: CLAD $X_{Al}$ COMPOSITION

FIG.9

| LAYER GROWN | TEMPERA-TURE | AℓAs MIXED CRYSTAL RATIO DIFFERENCE | AℓAs MIXED CRYSTAL RATIO | Aℓ - ADDED LEVEL (mg)* | GaAs - ADDED LEVEL (g)* |
|---|---|---|---|---|---|
| CLAD LAYER | 1000° | 0.1 | 0.75 | 558 | 5.16 |
| CLAD LAYER | 1000° | 0.2 | 0.7 | 446 | 5.97 |
| CLAD LAYER | 1000° | 0.3 | 0.68 | 411 | 6.29 |
| CLAD LAYER | 1000° | 0.4 | 0.65 | 365 | 6.77 |
| CLAD LAYER | 1000° | 0.5 | 0.62 | 326 | 7.25 |
| CLAD LAYER | 900° | | 0.03 | 4.5 | 6.90 |

* ADDED WEIGHT AGAINST Ga50g

| LAYER GROWN | TEMPERATURE | AℓAs MIXED CRYSTAL RATIO DIFFERENCE | AℓAs MIXED CRYSTAL RATIO | Aℓ - ADDED LEVEL (mg)* | GaAs - ADDED LEVEL (g)* |
|---|---|---|---|---|---|
| CLAD LAYER | 1000° | 0.1 | 0.75 | 558 | 5.16 |
| CLAD LAYER | 1000° | 0.2 | 0.7 | 446 | 5.97 |
| CLAD LAYER | 1000° | 0.3 | 0.68 | 411 | 6.29 |
| CLAD LAYER | 1000° | 0.4 | 0.65 | 365 | 6.77 |
| CLAD LAYER | 1000° | 0.5 | 0.62 | 326 | 7.25 |
| ACTIVE LAYER | 900° | | 0.36 | 76.4 | 4.73 |

* ADDED WEIGHT AGAINST Ga50g

LIGHT EMITTING DEVICE WITH ALAS MIXED CRYSTAL RATIOS

This application is a continuation-in-part, of application Ser. No. 08/169,622 filed Dec. 20, 1993, now abandoned.

BACKGROUND OF THE INVENTION

1. Technical Field

The present invention relates to a semiconductor light emitting device equipped with a light emitting region that is formed on a GaAs substrate utilizing a GaAlAs system material, and a manufacturing method therefor. The present invention particularly relates to the device where an operation life test is preferable under high temperature and high moisture (for example, 85° C. and 85%) and at a high output of infrared rays and visible rays. Moreover, it particularly relates to the device and the manufacturing method therefor where a yield for a pellet is desirably high.

2. Background Art

Figure 1A:
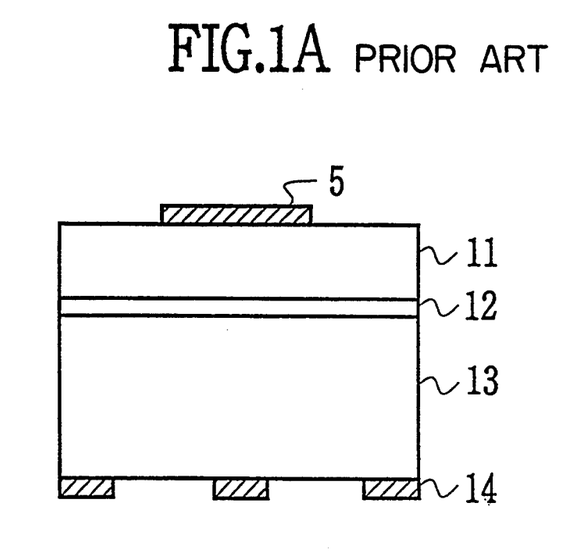
FIG. 1A is a structure according to the conventional semiconductor light emitting device.

FIG. 1A is a structure according to the conventional semiconductor light emitting device.

In the same figure, by use of a slow cooling method, on a p-type GaAs substrate, there are sequentially grown thereon a Zn-added p-type GaAlAs thick film clad layer 13, a Zn-added p-type GaAlAs active layer 12 (where an emitted light wavelength is a mixed crystal ratio for the infrared ray), and an Te-added n-type GaAlAs clad layer 11 so that a double hetero structure is obtained. In order to enable a high output thereof, the structure is generally such that the p-type GaAs substrate serving as a light-absorbing layer is removed and not used.

In order to realize a sufficient efficiency for the double hetero structure, an energy gap ($\Delta$eV) between the p-type GaAlAs thick film clad layer 13 and the n-type GaAlAs clad layer is set to more than 0.3 eV. However, due to the slow cooling method employed, an AlAs mixed crystal ratio for the n-type GaAlAs clad layer 11 is set to 0.7 or greater where the mixed crystal ratio therefor is little affected by temperature change. The higher AlAs mixed crystal ratio is, the less temperature dependency therefor is. This is because the mixed crystal ratio fluctuates less in a growth direction in this case. Thereby, a stress within a grown wafer is made small so as to increase a pellet-processing yield. The pellet-processing yield is represented by the number of pellets obtained from a single wafer.

The term "AlAs mixed crystal ratio" means an AlAs mixed crystal ratio relative to a GaAs crystal. For example, an AlAs mixed crystal ratio 0.7 means a composition of Ga(0.3).Al(0.7).As.

Figure 1B:
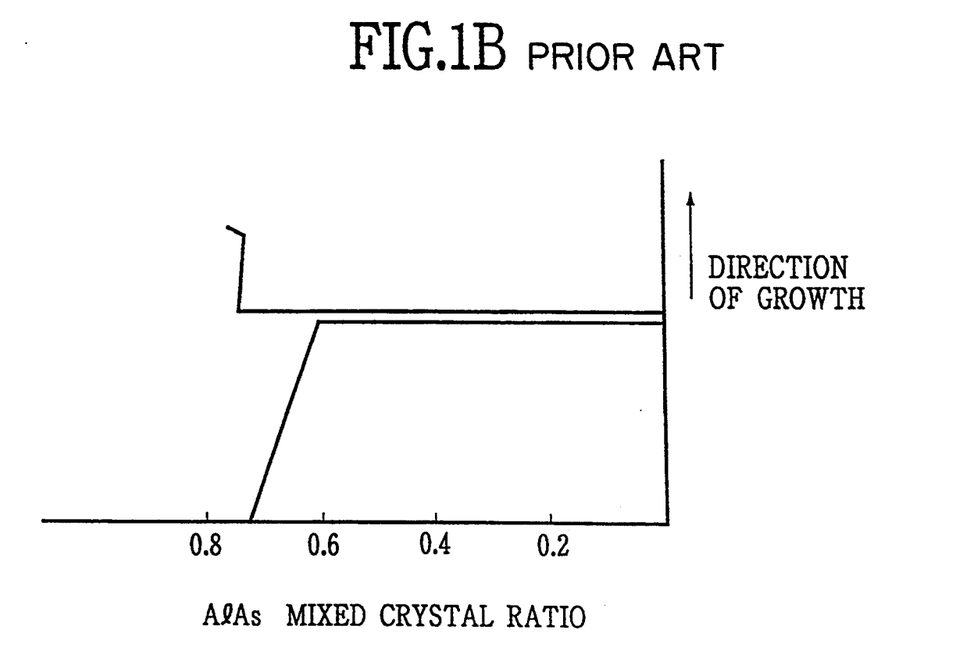
FIG. 1B is a graph showing distribution of the AlAs mixed crystal ratio along a direction of growth.

On the other hand, in an element structure of the conventional semiconductor light emitting device there is a problem where a crack occurs in the GaAlAs substrate in the course of a pellet-making process, so that the yield therefor is reduced. The crack in the GaAlAs substrate accounts for a stress generated in a grown layer due to a difference in the AlAs mixed crystal ratio (the mixed crystal ration of p-type GaAlAs active layer 12 excluded). Such a stress causes a bow (sori) in the GaAlAs substrate so as to generate the crack. Therefore, the reduction in the yield is prevented in a manner that the mixed crystal ratio ($X_{Al}$) between the p-type GaAlAs thick film clad layer 13 and the n-type GaAlAs clad layer 11 is made equal or the mixed crystal ratio for the n-type GaAlAs clad 11 is made higher than layer 13. FIG. 1B is a graph showing distribution of the AlAs mixed crystal ratio along a direction of growth.

Figure 2:
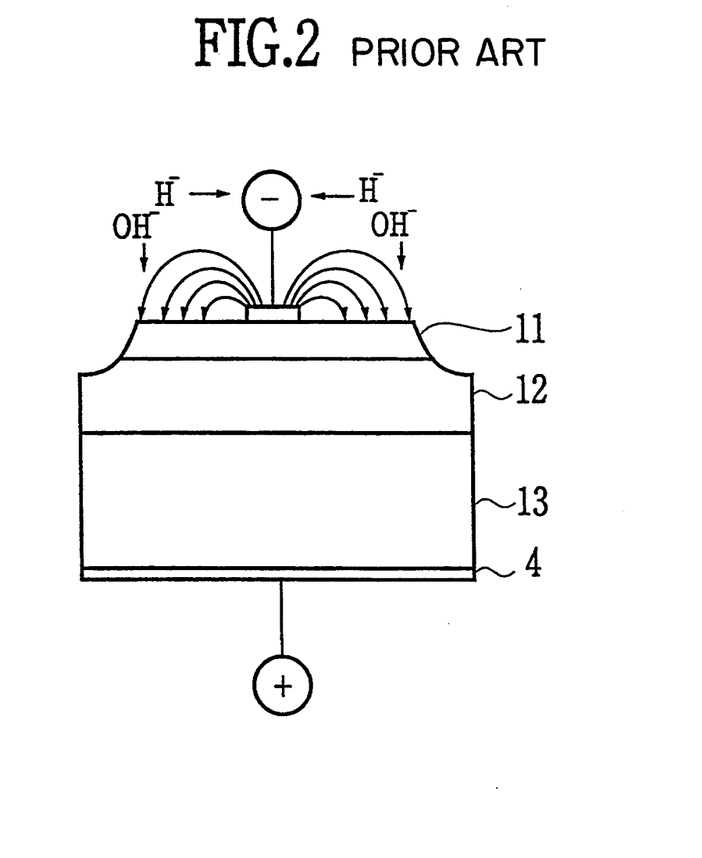
FIG. 2 illustrates a presumptive mechanism for deterioration caused by the operation life test under atmosphere of high temperature and high moisture.

By such a composition, an operation life test using 50 mA results under the high temperature and moisture of 85° C. and 85%, respectively:

Referring to FIG. 2, the above deterioration mechanism is presumably carried out, so that there is formed a light-absorbing layer on the surface of the pellet and external output therefrom is significantly reduced. In other words, a constant forward current causes Al to react with OH$^-$ ion. Then, on the surface of the pellet there is formed an oxide layer such as Al$_2$O$_3$ and Ga$_2$O$_3$ serving as the light-absorbing layer. Thereby, the deterioration in efficiency for the light emitting element (device) occurs. However, without presence of the constant forward current under the high temperature and moisture such as in a condition of 85° C. and 85% and the device being left alone for 2000 hours, the oxide layer on the surface of the pellet is not detected and a decline of the external output due to the deterioration is not observed. Therefore, it seems that a radiation ray from a junction also contributes to the forming of GaAlAs layer.

Accordingly, in the conventional semiconductor light emitting device there is caused a problem where there is formed the light-absorbing layer on the surface of the pellet under the high temperature and moisture so as to significantly reduce the external output. As a result thereof, an environmental condition under which the device can be utilized is undesirably limited, so that the device can only be usable in the vicinity of a room temperature.

SUMMARY OF THE INVENTION

In view of the foregoing drawbacks, it is therefore an object of the present invention to provide a semiconductor light-emitting device and a manufacturing method therefor by which the deterioration of the external output is sufficiently suppressed under the high temperature and moisture and the yield for the pellet is sufficiently high.

To achieve the object, there is provided a light emitting device of a double hetero structure, the device comprising: a first GaAlAs clad layer of a first conductivity type; an active layer formed on the first clad layer, the active layer having an appropriate AlAs mixed crystal ratio relative to a GaAs crystal so that an emitted light wavelength from the device is substantially between 620 and 940 nm; and a second GaAlAs clad layer of a second conductivity type formed on the active layer, wherein the AlAs mixed crystal ratio on the surface thereof in the second clad layer is equal to or less than 0.67, and is smaller than that in the first clad layer, and a difference of the AlAs mixed crystal ratio between the bottom layer of the first clad layer and the top layer of the second clad layer is equal to or less than 0.3.

Other features and advantages of the present invention will become apparent from the following description taken in conjunction with the accompanying drawings.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Figure 3:
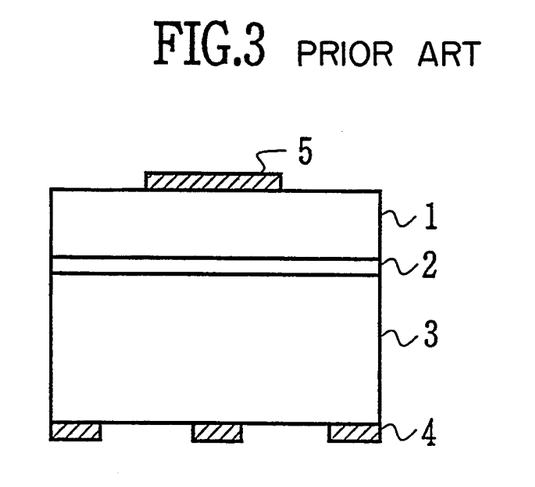
FIG. 3 is a cross sectional structure of the semiconductor light emitting device according to the first and second embodiment.

With reference to FIG. 3, the first embodiment will be described.

In the same figure, the following layers are formed, in a given sequential order, on a p-type GaAs substrate by utilizing a slow cooling method which is a liquid-phase epitaxial growth technique:

p-type $Ga_{0.28}Al_{0.72}$ As clad layer 3,
p-type $Ga_{0.97}Al_{0.03}$ As active layer 2 and
n-type $Ga_{1-x}Al_xAs$ clad layer 1, thereby forming a double hetero structure.

As a p-type impurity, zinc (Zn) is used, while tellurium (Te) is used as an n-type impurity. Zn of 100 mg is added to p-type $Ga_{0.28}Al_{0.07}As$ clad layer 3, whereas Zn of 30 mg is added to p-type $Ga_{0.97}Al_{0.03}$ As active layer 2. Te of 4 mg is added to n-type $Ga_{1-x}Al_x$ As clad layer 1.

Figure 4:
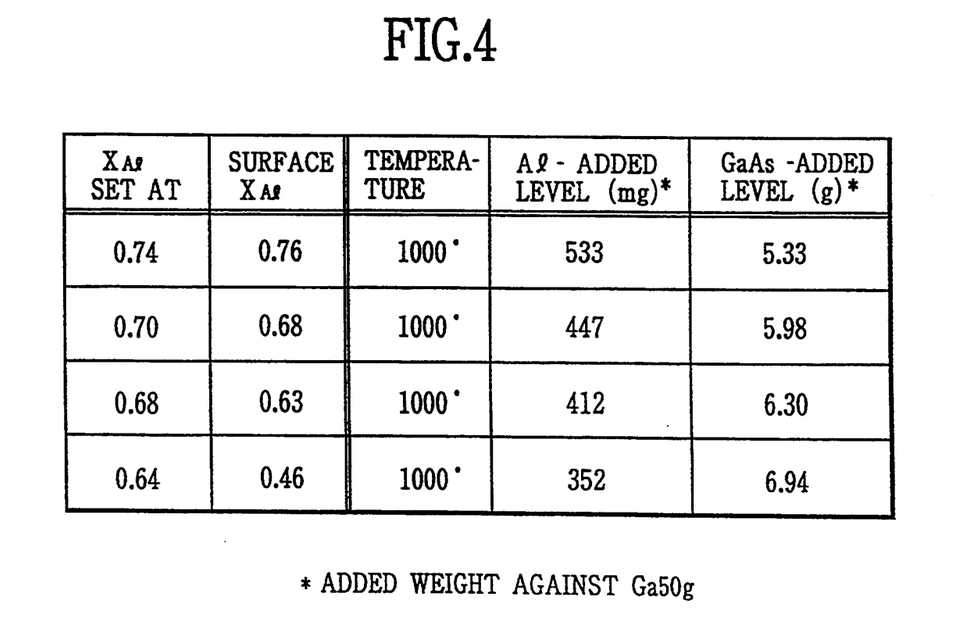
FIG. 4 is a table showing composition for the grown solution against the mixed crystal ratio of AlAs surface in the n-type GaAlAs clad layer and the added quantity thereof, according to the first embodiment.

In order to achieve a mixed crystal ratio x of the surface AlAs in n-type $Ga_{1-x}Al_xAs$ clad layer 1 such that x are 0.76, 0.68, 0.63 and 0.46, respectively, a solution composition for n-type $Ga_{1-x}Al_xAs$ clad layer 1 are set to 0.74, 0.70, 0.68 and 0.64, respectively. Then, the solution composition against Ga of 50 g are indicated in FIG. 4. The solution composition shown in FIG. 4 means the addition quantity of Al and GaAs.

Figure 11:
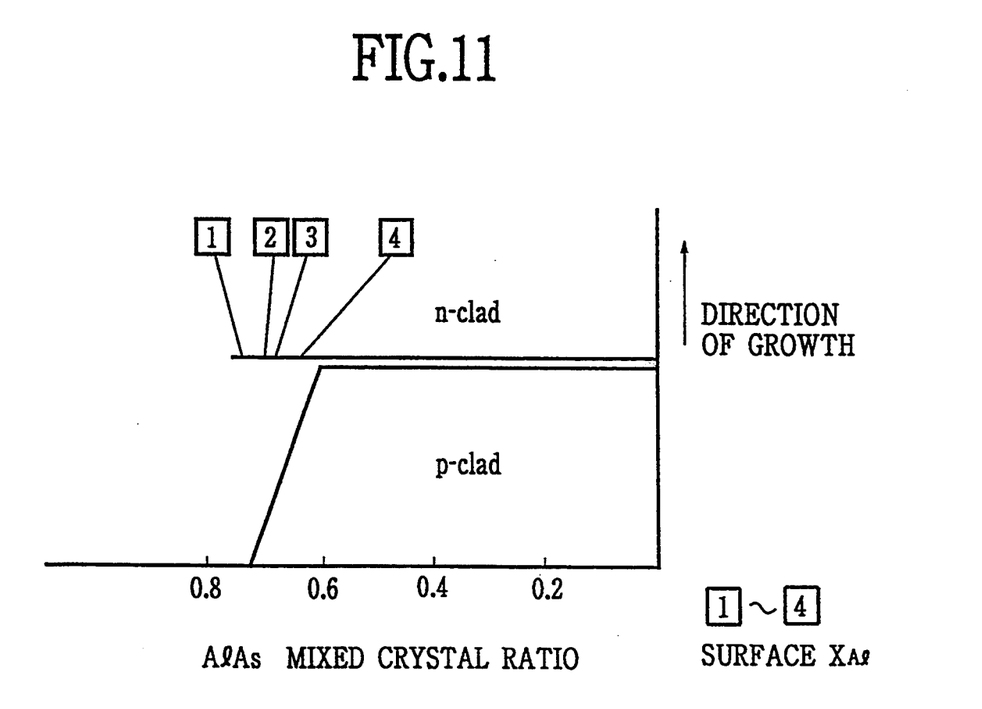
FIG. 11 is a graph showing distribution of the AlAs mixed crystal ratio along a direction of growth, according to the first embodiment in relation with a table shown in FIG. 4.

FIG. 11 is a graph showing distribution of the AlAs mixed crystal ratio along a direction of growth, according to the first embodiment in relation with a table shown in FIG. 4. In FIG. 11, the curve marked with 1 (number 1 enclosed with square) represents the content shown in FIG. 4. Namely, it represents the distribution of growth direction in terms of the AlAs mixed crystal ratio where the growth direction starts at 0.74 at the outset and then becomes 0.76 in the end. Similarly, the curve marked with 2 represents the distribution of growth direction in terms of the AlAs crystal mixed ratio where it starts at 0.70 and then becomes 0.68 in the end. As for the curves marked with 3 and 4, the distribution of the growth direction changes from 0.68 to 0.63, and from 0.64 to 0.46 in terms of the AlAS mixed crystal ratio, respectively.

Figure 5:
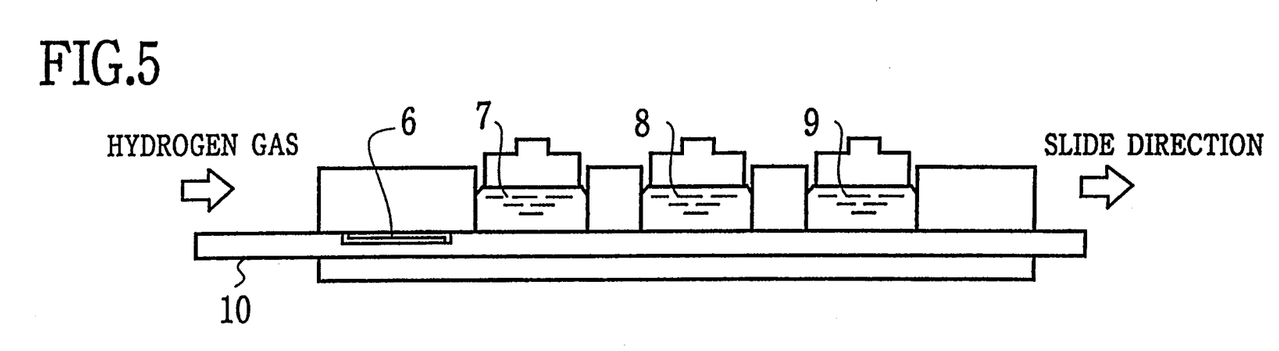
FIG. 5 illustrates a method of manufacturing the light emitting device shown in FIG. 3.
Figure 6:
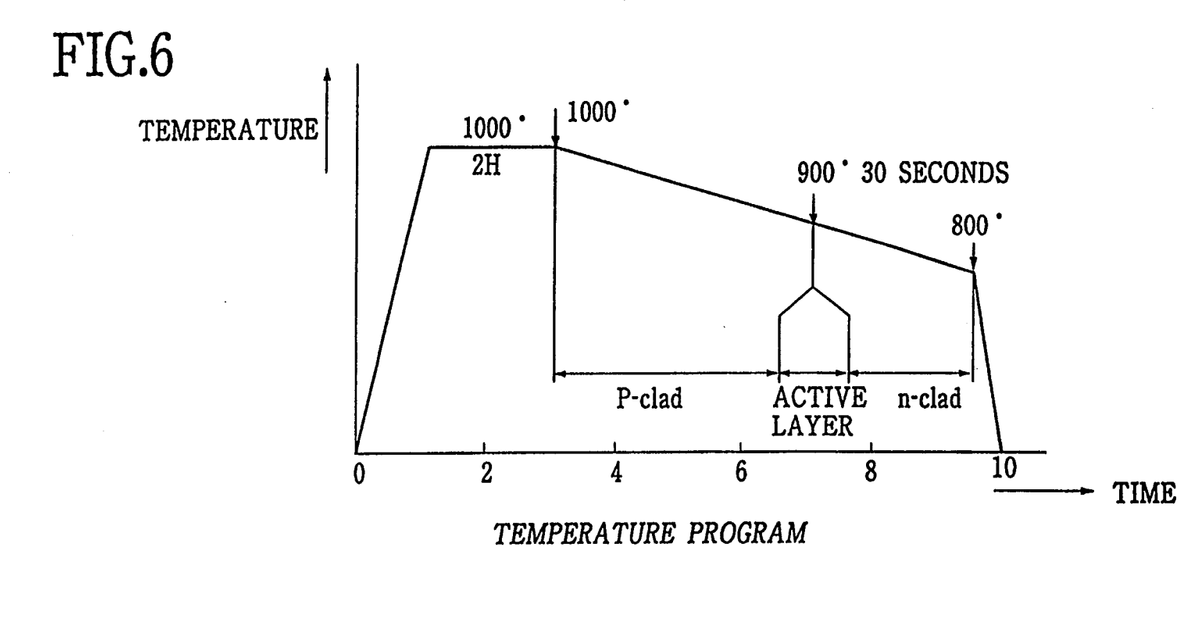
FIG. 6 is a temperature program under the growth condition.

With reference to FIG. 5 and FIG. 6, crystal growth is performed by utilizing a boat configured in FIG. 5 and under a growth condition as per a temperature program shown in FIG. 6.

After the crystal growth is achieved, the p-type GaAs substrate is removed by use of ammonium-oriented solution. Thereafter, referring to FIG. 3, predetermined p-type locally-dispersed ohmic contact electrode 4 such as Au—Be electrode and n-type circular ohmic electrode 5 such as Au—Ge electrode are formed on both sides of GaAlAs growth substrate composed of reference numerals 1, 2 and 3. Then, each element is separated by carrying out a dicing operation such as a diamond-blade dicing technique, a wiresaw dicing or combined technique therewith.

Figure 7:
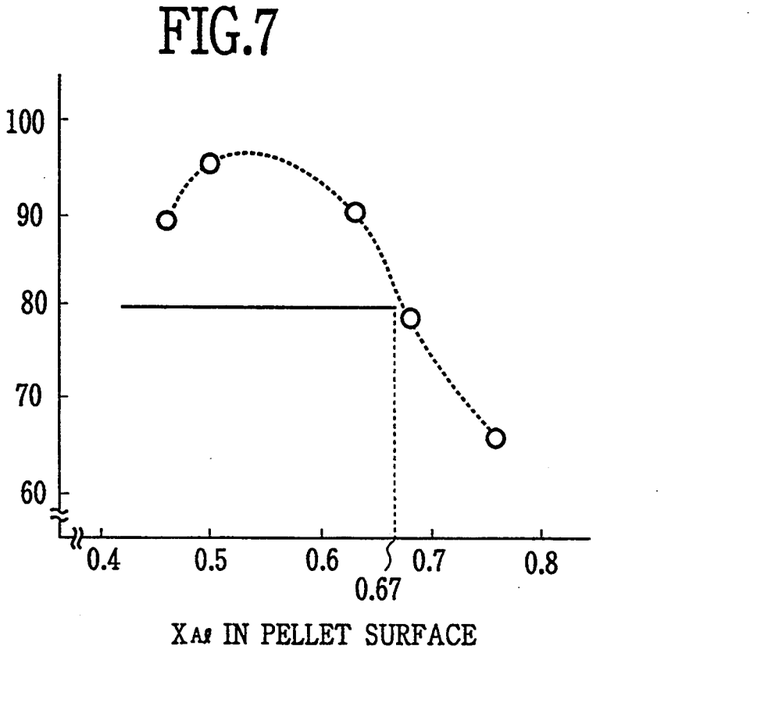
FIG. 7 is a graph showing the crystal mixed ratio ($X_{A1}$) of AlAs surface in n-type GaAlAs clad layer 3, and the relative radiant output obtained after an operation life test for the high-temperature & high-moisture for 1000 hours.

The element formed and separated under each growth condition is mount-bonded to a ceramics stem. Thereafter, performed is a high-temperature and high-moisture test for 1000 hours where a condition therefor is, for example, at 85° C., 85% and 50 mA. Then, an initial external output prior to the test is compared with an external output obtained after completion of the test, so that a relative radiant output for the light emitted externally is investigated. FIG. 7 is a graph showing the crystal mixed ratio ($X_{A1}$) of AlAs surface in n-type GaAlAs clad layer 3, and the relative radiant output obtained after an operation life test for the high-temperature & high-moisture for 1000 hours. In FIG. 7, the solid straight line which lies horizontal to a horizontal axis ($X_{A2}$) represents a relative radiant output.

Referring to FIG. 7, a standard value of the relative radiant output that is 80% or greater is achieved when the mixed crystal ratio ($X_{A1}$) of the AlAs surface in n-type GaAlAs clad layer 3 is 0.67 or below. From the point of view in the relative radiant output, a lower mixed crystal ratio ($X_{A1}$) of the AlAs surface is preferable, for example, at 0.46. However, this lower point may cause a problem concerning the pellet yield where the pellet yield is reduced due to a crack of GaAlAs growth substrate. The crack of GaAlAs growth substrate is caused by a stress generated inside the growth layer at time the device is prepared as a pellet.

In accordance with experimentations conducted above, it is confirmed that a standard value of the relative radiant output is achieved when the mixed crystal ratio ($X_{Al}$) of AlAs surface in n-type GaAlAs clad layer 3 is 0.67 or less.

A semiconductor light emitting device according to the second embodiment will be described as follows.

The structure therefor is similar to that of the first embodiment. Namely, the double hereto structure comprises p-type GaAlAs clad layer 3, p-type $Ga_{0.97}Al_{0.03}As$ active layer 2 and n-type $Ga_{1-x}Al_xAs$ clad layer 1 formed in this sequential order, on a p-type GaAs substrate by utilizing a slow cooling method which is a liquid-phase epitaxial growth technique.

As for the impurity, similar one in the first embodiment is utilized in the second embodiment. Then, the p-type GaAs substrate is removed so that p-type locally-dispersed ohmic contact electrode 4 such as Au—Be electrode and n-type circular ohmic electrode 5 such as Au—Ge electrode are attached to the device shown in FIG. 3. Note that the p-type GaAs substrate serves as a light-absorbing layer due to a high output therein.

Figure 9:
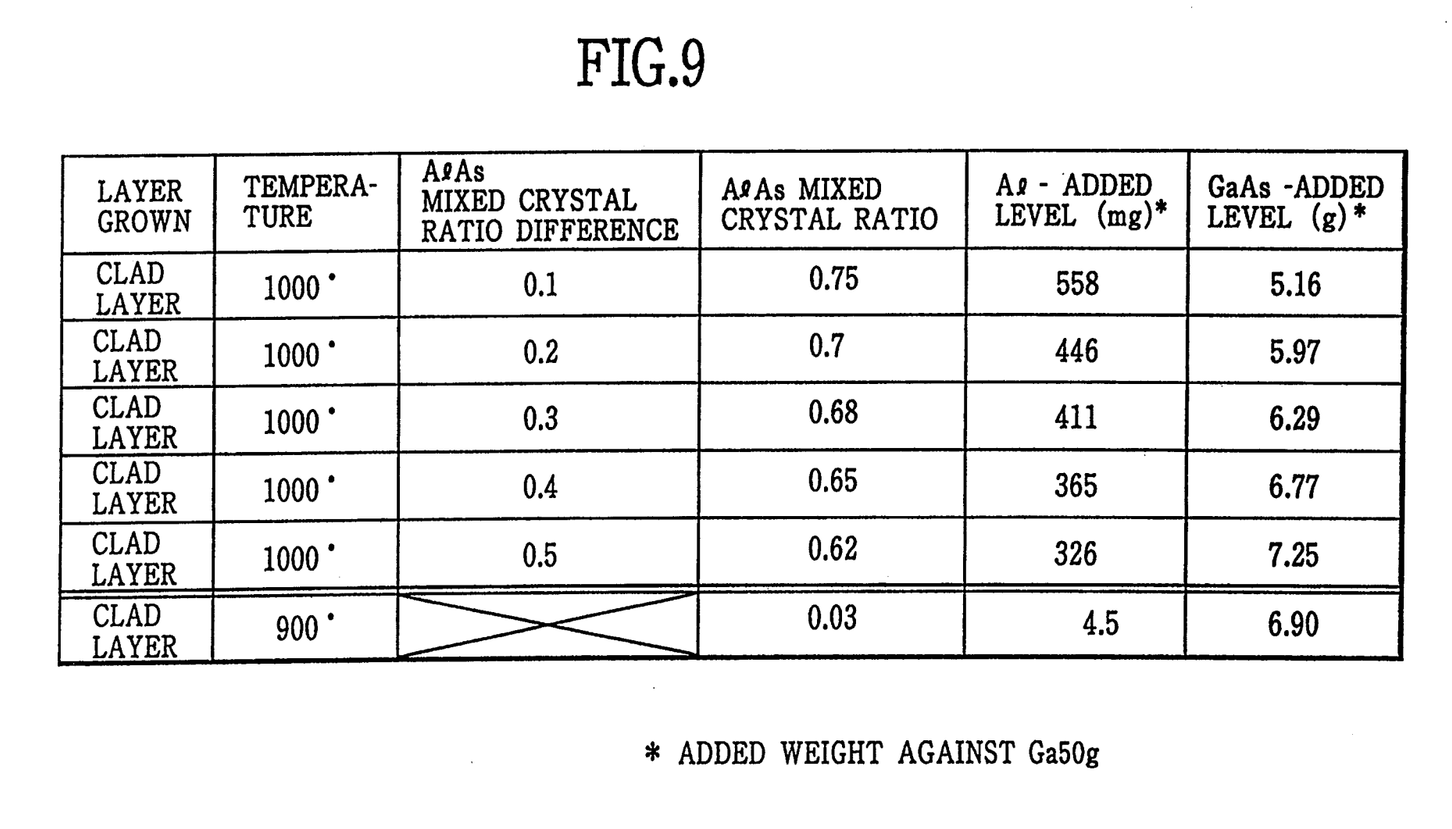
FIG. 9 is a table showing solution composition (added quantity of Al and GaAs) against 50 grams of Ga.

It is intended to obtain AlAs mixed crystal ratio difference ($\Delta X_{Al}$) between a growth composition of p-type GaAlAs clad layer 3 at start time of the growth and a growth composition of n-type GaAlAs clad layer 1 at completion time of the growth. In order to achieve the difference such that $\Delta X_{Al}$ is set to 0.5, 0.4, 0.3, 0.2 and 0.1, respectively. FIG. 9 is a table showing solution composition (added quantity of Al and GaAs) against 50 grams of Ga.

Figure 8:
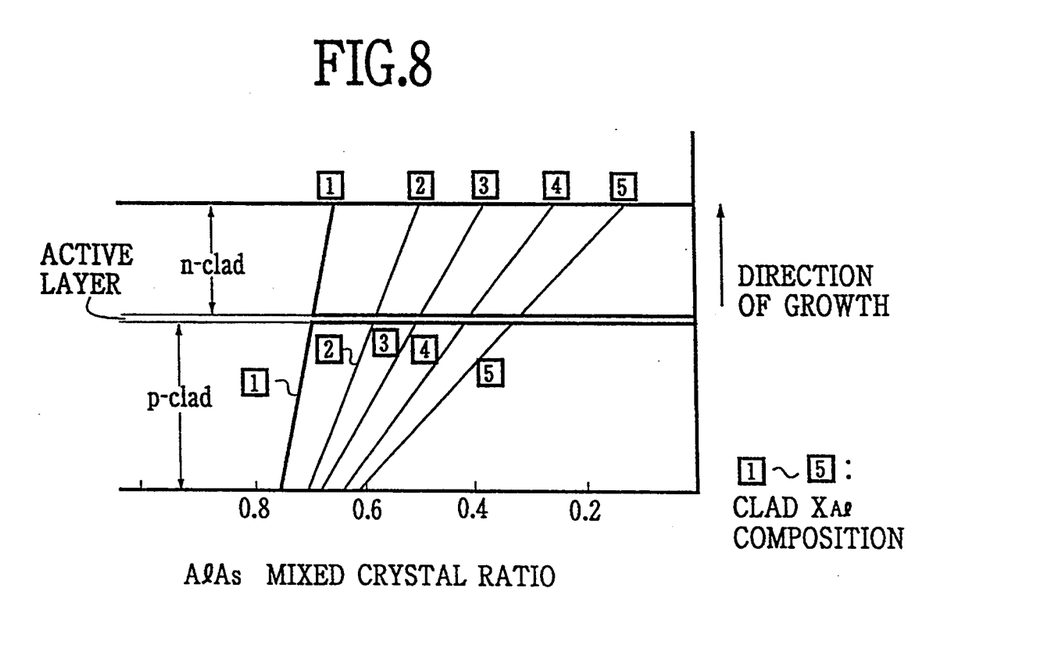
FIG. 8 shows a direction of growth relative to the AlAs mixed crystal ratio depicted in FIG. 9, according to the second embodiment.

FIG. 8 is a graph showing distribution of the AlAs mixed crystal ratio along a direction of growth, according to the second embodiment in relation with a table shown in FIG. 9. FIG. 8 shows composition change in AlAs mixed crystal ratio from start to end thereof under a particular AlAs mixed crystal ratio where composition thereof is same at both p-clad and n-clad. In FIG. 8, the curve marked with 1 (number 1 enclosed with square) represents the content shown in FIG. 9. Namely, it represents the distribution of growth direction in terms of the AlAs mixed crystal ratio where the growth direction starts at 0.75 with the AlAs mixed crystal ratio difference being 0.1, that is, the surface AlAs mixed crystal ratio is 0.65. Similarly, the curve marked with 2 represents the distribution of growth direction in terms of the AlAs crystal mixed ratio where it starts at 0.70 and then becomes 0.50 with the AlAs mixed crystal ratio difference being 0.2. As for the curves marked with 3, 4 and 5, the distribution of the growth direction changes from 0.68 with the AlAs mixed crystal ratio difference of 0.3, from 0.65 with 0.4, and 0.62 with 0.5, respectively.

Figure 10:
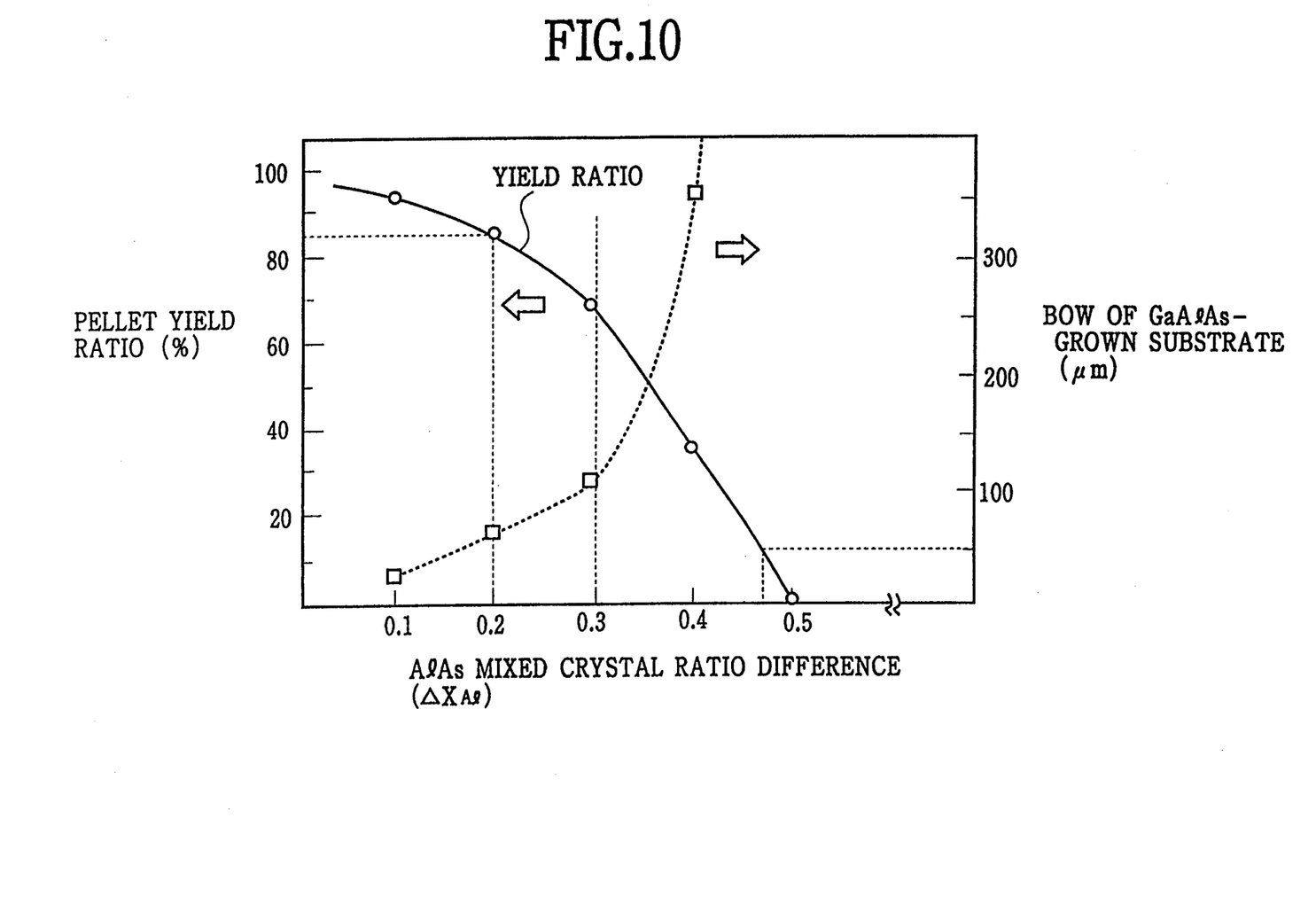
FIG. 10 shows the pellet yield ratio and the bow (sori) of GaAlAs growth substrate against the $\Delta X_{A1}$.

In the device (element) formed and separated under each growth condition, FIG. 10 shows the pellet yield ratio and the bow (sori) of GaAlAs growth substrate against the $\Delta X_{Al}$.

As evidenced from FIG. 10, when the AlAs mixed crystal ratio difference ($\Delta X_{Al}$) is below 0.3, the sori level of GaAlAs growth substrate is about 100 μm. Then, the pellet yield ratio rises to about 70%, so that a significant improvement is confirmed in the pellet yield ratio. This significant improvement accounts for reduction of stress that is caused by composition difference within the GaAlAs growth substrate. In other words, the level of sori in the GaAlAs growth substrate is reduced, so that the crack of the GaAlAs growth substrate in the course of removing the GaAs substrate is reduced. Moreover, the crack in the course of a patterning process of ohmic electrodes 4, 5 is reduced thereby. As a result thereof, the pellet yield ratio is significantly improved. It is to be noted that the pellet yield is represented by the number of pellets taken out of a single wafer.

Based on the above experiments, in the event that the AlAs mixed crystal ratio difference $\Delta X_{Al}$ is smaller than 0.3 it is confirmed that a significantly high pellet yield is achieved.

The AlAs mixed crystal ratio $X_{Al}$ of n-type GaAlAs clad layer 1 can be set to between 0.63 and 0.46, preferably in the vicinity of 0.50, and the $X_{Al}$ of p-type GaAlAs clad layer 3 can be set to as low as 0.66 in a manner that the AlAs mixed crystal ratio difference $\Delta X_{Al}$ becomes less than 0.2. As a result thereof, the pellet yield ratio is further increased, and the device produced under such a condition can easily pass a necessary standard level in the high-temperature and high-moisture operation life test.

Next, a third embodiment according to the present invention will be described in detail.

The construction thereof is similar to that of the first embodiment. The third embodiment is characterized in that the light emitting wavelength is set to approximately 620–940 nm, whereas the light emitting wavelength for the light emitting device having the double hetero structure in a GaAlAs system is in the range of approximately 850±50 nm.

For example, when the light wavelength emitted by the device is set at 620 nm, the maximum AlAs mixed crystal ratio is achieved when the AlAs mixed crystal ratio of the emitting active layer is of the direct transition type.

By setting the composition of active layer 2 at approximately 0 to 0.45, a light emitting semiconductor device can be obtained which presents a significantly high pellet yield.

Figure 12:
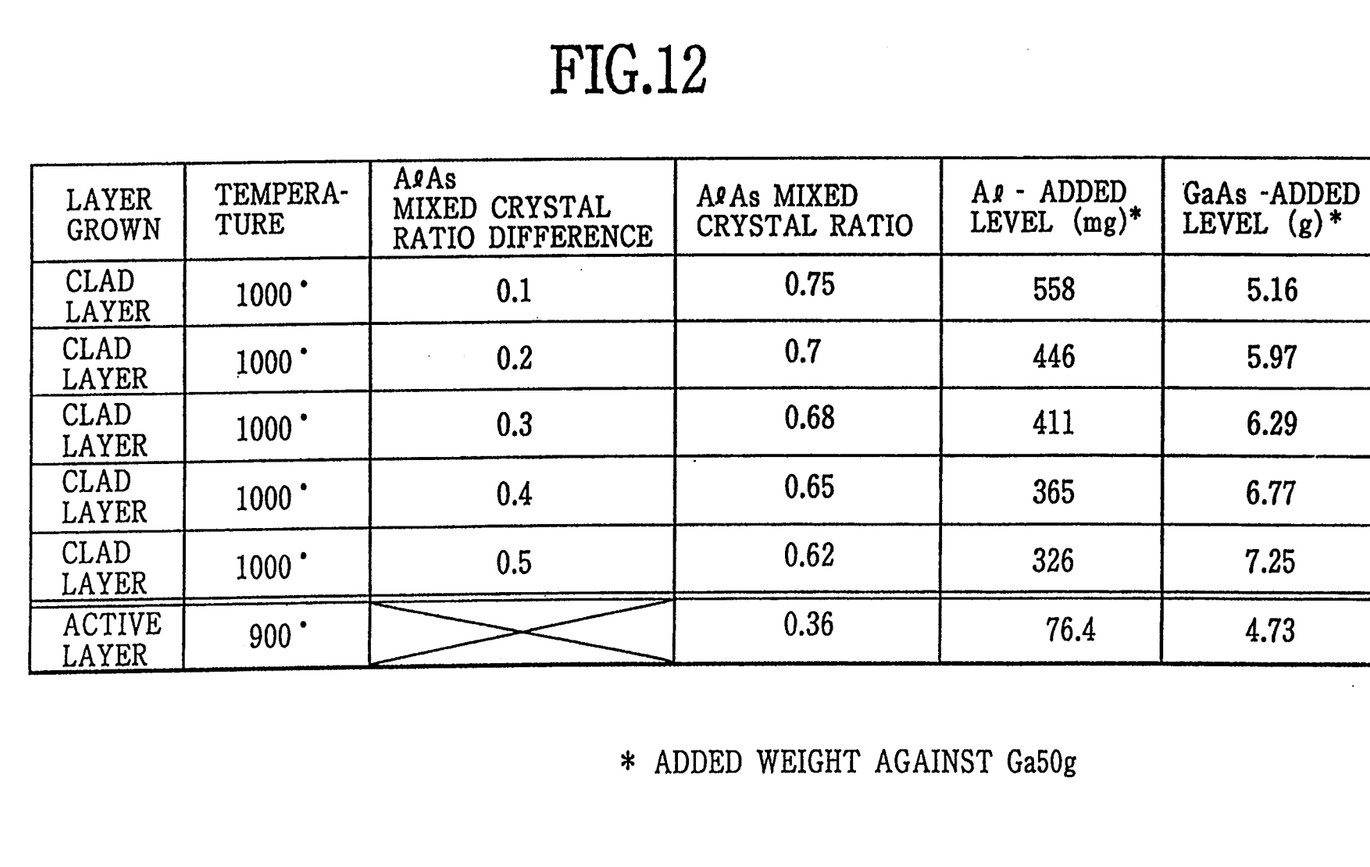
FIG. 12 is a table showing solution composition wherein the clad layer at a temperature of 900° C. shown in the last row of FIG. 9 is replaced with an active layer.

Referring to FIG. 12, by setting the AlAs mixed crystal ratio at approximately 0.36, the device will emit a wavelength of approximately 660 nm.

Even though the composition of the active layer is changed to obtain emission of visible rays instead of infrared rays, the composition of both the n-type clad layer and the p-type clad layer remains unchanged since each layer is separated, as shown in a boat of FIG. 5. Similarly, the temperature program remains the same as in the first embodiment.

An emitted light wavelength of approximately 940 nm can be obtained in the GaAs light emitting diode when silicon is utilized as doping material. In a similar manner, a wavelength of approximately 940 nm can also be obtained in the GaAlAs system when the active layer is doped with silicon instead of zinc.

In summary, according to the present invention, the double hetero structure is realized where the mixed crystal ratio of the AlAs surface is equal to or less than 0.67 and the AlAs mixed crystal ratio difference $\Delta X_{Al}$ between a first conductive GaAlAs clad layer 3 and a second conductive GaAlAs clad layer 1 is equal to or less than 0.3. The double hetero structure is, by utilizing the slow cooling method in the liquid-phase epitaxial growth technique, formed of and composed of a first conductive type GaAlAs clad layer 3 formed on a first conductivity type GaAs substrate, a second conductivity type GaAlAs active layer 2 on the layer 3 in which the AlAs mixed crystal ratio is set such that emitted light wavelength is within a range of 620 to 940 nm and the mixed crystal ratio of the AlAs surface is equal to and less than 0.67. In one embodiment of the claimed invention, the emitted wavelength can also be limited to a range of 850±50 nm. By employing such the device and method according to the present invention, formation of oxide film is maximally suppressed so as to reduce deterioration for the device. In order words, the deterioration of the external output of the light emission under the operation life test at an atmosphere of high temperature and high moisture is maximally suppressed. Moreover, the present invention offers a semiconductor light emitting apparatus and a manufacturing method therefor where the production yield or pellet yield is significantly high.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A light emitting device of double hetero structure, the device comprising:
    a first GaAlAs clad layer of a first conductivity type and having a bottom layer portion and a top layer portion;
    an active layer formed on the top layer portion of the first clad layer, the active layer having an appropriate AlAs mixed crystal ratio relative to a GaAs crystal so that an emitted light wavelength from the device is substantially between 620 and 940 nm, and
    a second GaAlAs clad layer of a second conductivity type and having a bottom layer portion formed on the active layer, and a top layer portion,
    wherein the AlAs mixed crystal ratio of the top layer portion of the second clad layer is equal to or less than 0.67, and is smaller than the AlAs mixed crystal ratio in the bottom layer portion of the first clad layer, and a difference of the AlAs mixed crystal ratios of the bottom layer portion in the first clad layer and the top layer portion in the second clad layer is equal to or less than 0.3.

2. The device of claim 1, wherein the active layer is provided such that the emitted light wavelength from the device is substantially 850±50 nm.

3. The device of claim 1, wherein the active layer is of the second conductivity type.

4. The device of claim 3, wherein the AlAs mixed crystal ratio of the active layer is substantially between 0 and 0.45.

5. The device of claim 3, wherein silicon is employed as a doping material in the active layer.

6. A light emitting device of double hetero structure, the device comprising:
    a first GaAlAs clad layer of a first conductivity type and having a bottom layer portion and a top layer portion;
    an active layer formed on the top layer portion of the first clad layer, the active layer having an appropriate AlAs mixed crystal ratio relative to a GaAs crystal so that an emitted light wavelength from the device is substantially between 620 and 940 nm, and
    a second GaAlAs clad layer of a second conductivity type and having a bottom layer portion formed on the active layer, and a top layer portion,
    wherein the AlAs mixed crystal ratio of the top layer portion of the second clad layer is equal to or less than 0.67, and is smaller than the AlAs mixed crystal ratio in the bottom layer portion of the first clad layer.

* * * * *